(12) United States Patent
Yonemaru

(10) Patent No.: US 6,559,700 B2
(45) Date of Patent: May 6, 2003

(54) SEMICONDUCTOR INTEGRATED CIRCUIT

(75) Inventor: Masashi Yonemaru, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/986,144

(22) Filed: Nov. 7, 2001

(65) Prior Publication Data

US 2002/0053936 A1 May 9, 2002

(30) Foreign Application Priority Data

Nov. 7, 2000 (JP) ......................................... 2000-339748

(51) Int. Cl.⁷ .......................... H03H 11/26; H03K 3/289
(52) U.S. Cl. ....................................... 327/284; 327/203
(58) Field of Search ................................. 327/202, 203, 327/403, 404, 407, 408, 261, 270, 276, 277, 284

(56) References Cited

U.S. PATENT DOCUMENTS

| | | | | |
|---|---|---|---|---|
| 5,239,206 A | * | 8/1993 | Yanai ........................... | 327/202 |
| 5,250,852 A | * | 10/1993 | Ovens et al. ................. | 327/202 |
| 5,633,606 A | * | 5/1997 | Gaudet et al. ............... | 327/202 |
| 5,754,070 A | * | 5/1998 | Baumann et al. ............ | 327/202 |
| 5,982,211 A | * | 11/1999 | Ko ............................... | 327/202 |
| 6,188,260 B1 | * | 2/2001 | Stotz et al. .................. | 327/202 |

FOREIGN PATENT DOCUMENTS

JP     A10-135814     5/1998

OTHER PUBLICATIONS

Low–Power CMOS Digital Circuits, Chapter 6, B.2. Complementary Pass Transistor Logic, pp. 202–204.

* cited by examiner

*Primary Examiner*—Toan Tran
(74) *Attorney, Agent, or Firm*—Birch, Stewart, Kolasch & Birch, LLP

(57) ABSTRACT

A semiconductor integrated circuit includes a plurality of logical elements connected in series or parallel, the plurality of logical elements including a semiconductor substrate and an insulating layer provided on the semiconductor substrate; and a buffer circuit connected between a logical element group including at least two of the plurality of logical elements and another logical element group including at least two of the plurality of logical elements.

29 Claims, 12 Drawing Sheets

FIG.13
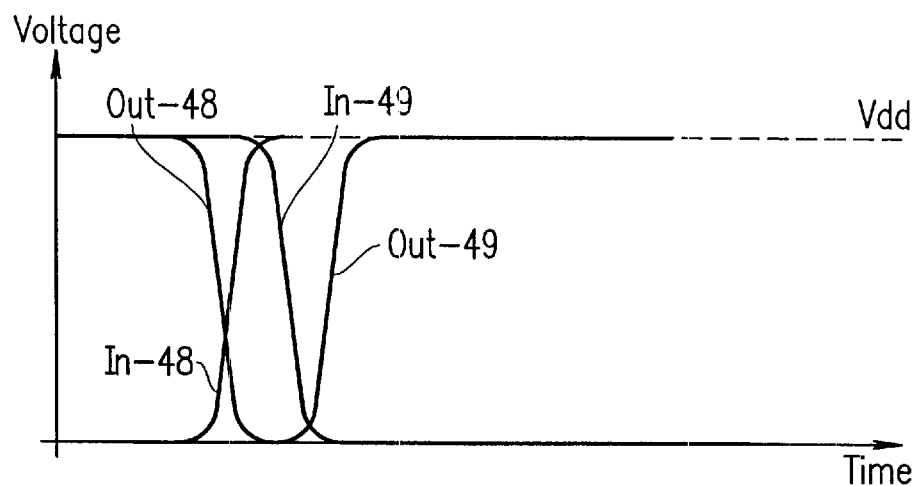
FIG.14
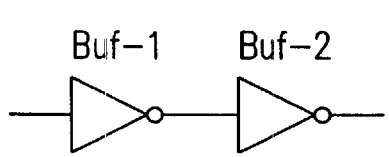
140
Buf-1   Buf-2
FIG.15
Vdd=0.5V
| Pass transistor network | Intermediate buffer circuit | Delay time | Current consumption ratio |
|---|---|---|---|
| NMOS | None | 21.5 nsec | 100% |
| NMOS | Figure 2 | 12.0 nsec | 73% |
| NMOS | Figure 4 | 10.0 nsec | 67% |
| NMOS | Figure 6 | 8.0 nsec | 63% |
| CMOS | None | 9.0 nsec | 78% |
| CMOS | Figure 2 | 7.0 nsec | 75% |
| CMOS | Figure 4 | 7.0 nsec | 70% |
| CMOS | Figure 6 | 6.0 nsec | 67% |

SEMICONDUCTOR INTEGRATED CIRCUIT

BACKGROUND OF THE INVENTION

1. Field of the Invention

The present invention relates to a semiconductor integrated circuit capable of operating at a high speed at a low voltage, and in particular to a semiconductor integrated circuit using a pass transistor logic circuit including a combination of FET pass transistor gates.

2. Description of the Related Art

A conventional pass transistor logic circuit is disclosed in Low-Voltage/Low-Power Integrated Circuits and Systems, IEEE PRESS, pp. 202–204 and Japanese Laid-Open Publication No. 10-135814.

FIG. 16 shows an example of a conventional pass transistor logic circuit. The pass transistor logic circuit shown in FIG. 16 includes a buffer circuit 59 and a pass transistor network 60. The pass transistor network 60 is connected to the buffer circuit 59 through a connection line 50a.

The buffer circuit 59 includes a CMOS inverter 59a including a P-type MOSFET 59b and an N-type MOSFET 59c, and a pull-up P-type MOSFET 59d. A source of the P-type MOSFET 59b is connected to a power supply line 50, and a drain and a gate of the P-type MOSFET 59b are respectively connected to a drain and a gate of the N-type MOSFET 59c. A source of the N-type MOSFET 59a is connected to a GND line 51 (i.e., grounded). The gate of the P-type MOSFET 59b and the drain of the N-type MOSFET 59c act as an input terminal 50c, and the drain of the P-type MOSFET 59b and the gate of the N-type MOSFET 59c act as an output terminal 58. A source of the P-type MOSFET 59d is connected to the power supply line 50, and a gate and a drain of the P-type MOSFET 59d are respectively connected to the output terminal 58 and the input terminal 50c.

The pass transistor network 60 includes four N-type MOSFETs 52, 53, 56 and 57 which form a pass transistor tree. A drain of the N-type MOSFET 52 is connected to a drain of the N-type MOSFET 57. A gate and a source of the N-type MOSFET 57 are respectively connected to a control input terminal 57a and an input terminal 55b. A gate of the N-type MOSFET 52 is connected to a control input terminal 52a. A source of the N-type MOSFET 52 is connected to a drain of the N-type MOSFET 53 and also to a drain of the N-type MOSFET 56. Similarly, a gate and a source of the N-type MOSFET 53 are respectively connected to a control input terminal 53a and an input terminal 54a. A gate and a source of the N-type MOSFET 56 are respectively connected to a control input terminal 56a and an input terminal 55b.

Signals which are input to an input terminal 54a, 55a and 55b respectively connected to the sources of the three N-type MOSFETs 53, 56 and 57 are processed with a prescribed logic operation based on a signal applied to the control input terminals 52a, 53a, 56a and 57a. The resultant signal is output to the input terminal 50c of the CMOS inverter 59a of the buffer circuit 59 through the connection line 50a from a connection point 50b between the drains of the two N-type MOSFETs 52 and 57. The signal is amplified and waveform-shaped by the CMOS inverter 59a and output from the output terminal 58 of the CMOS inverter 59a to an external circuit.

The pass transistor network 60 shown in FIG. 16 includes a two-stage pass transistor tree, but a more complicated logic circuit includes a pass transistor tree of more than two stages. FIG. 17 shows an example of such a pass transistor network 80.

FIG. 17 shows a pass transistor logic circuit including the pass transistor network 80 including six N-type MOSFETs 61m through 66m connected in series, and a buffer circuit 68 including a CMOS inverter and a pull-up P-type MOSFET, like the buffer circuit 59. The six N-type MOSFETs 61m through 66m are connected in series through connection of a drain and a source of two adjacent MOSFETs. A drain of the sixth-stage N-type MOSFET 66m is connected to an input terminal of the buffer circuit 68 (i.e., an input terminal of the CMOS inverter). The pass transistor network 80 includes control input terminals 61 through 66 and an input terminal 67. The control input terminals 61 through 66 are respectively connected to gate terminals of the N-type MOSFETs 61m through 66m. The input terminal 67 is connected to a source of the N-type MOSFET 61m.

A signal which is input to the input terminal 67 is processed with a prescribed logic operation based on signals applied to the control input terminals 61 through 66. The resultant signal is output from the drain of the N-type MOSFET 66m to the input terminal of the CMOS inverter of the buffer circuit 68. The signal is amplified and waveform-shaped by the CMOS inverter and output from an output terminal 69 of the buffer circuit 68, the output terminal 69 being connected to an output terminal of the CMOS inverter.

FIG. 18 is a graph illustrating a delay characteristic of an input/output voltage of the pass transistor logic circuit shown in FIG. 17. The horizontal axis represents time, and the vertical axis represents the input/output voltage. An input voltage In-68 shown in FIG. 18 represents a voltage of a signal which is input to the input terminal 67 of the pass transistor network 80. The input voltage In-68, which periodically changes from a LOW level to a HIGH level, passes through the N-type MOSFETs 61m through 66m connected in series and then is input to the input terminal of the buffer circuit 68. The signal is then output to the output terminal 69 of the buffer circuit 68. An output voltage Out-68 represents a voltage of the signal which is output to the output terminal 69. The input voltage In-68 increases from the ground level GND to the supply voltage level Vdd over-time. The output voltage Out-68 is obtained by inversion performed by the CMOS inverter, and thus decreases from the supply voltage level Vdd to a level representing an OFF state.

As described above, the pass transistor network 80 includes six N-type MOSFETs 61m through 66m. Therefore, when the input voltage of the buffer circuit 68 changes from the LOW level to the HIGH level, the voltage level does not rise to the supply voltage level Vdd but rises only to a voltage level which is lower than the supply voltage level Vdd by a threshold voltage of the N-type MOSFETs. The input voltage In-68 increases over-time, and the drain-source voltage and the gate-source voltage of each of the N-type MOSFETs 61m through 66m decrease. Therefore, the amplification degree of each of the Ntype MOSFETs 61m through 66m approaches an OFF region (saturation region), and the gradient of rise of the input voltage of the buffer circuit 68 from the LOW level to the HIGH level is slower. When the input voltage In-68 becomes Vi at time t0, the output voltage Out-68 at the output terminal 69 decreases from the supply voltage level Vdd by a threshold voltage of the P-MOSFET to a level Vo. Therefore, the P-MOSFET is turned ON, and the input voltage In-68 is raised to the supply voltage level Vdd (i.e., pulled up). The pulled-up voltage In-68 is input to the buffer circuit 68, and a signal having the output voltage Out-68 is output from the output terminal 69 of the buffer circuit 68.

Since a signal which is input to the input terminal 67 passes through the six N-type MOSFETs 61m through 66m connected in series, the signal rises from a LOW level to a HIGH level very slowly and thus the propagation time of the signal is increased. In the buffer circuit 68 having a CMOS inverter, when the rise of the input signal from a LOW level to a HIGH level is slow, a significant delay is caused in the signal propagation time before the input voltage In-68 reaches the signal inversion level (threshold level). In addition, since the transition time before the input voltage In-68 reaches the signal inversion level is excessively long, a large shoot-through current flows, resulting in an increase in the current consumption. In the case where an input signal sent from the pass transistor network 80 to the buffer circuit 68 has an excessively low level, the signal inversion level of the CMOS inverter cannot be fulfilled and as a result, the operation of the buffer circuit 68 may stop.

The N-type MOSFETs 61*m* through 66*m* and the pull-up P-type MOSFET and the CMOS inverter included in the buffer circuit 68 are designed using a commonly used bulk process.

FIG. 19 shows an exemplary structure of the CMOS inverter included in the buffer circuit 68. The CMOS inverter includes a semiconductor substrate 81, an Ntype well layer 82 included in a P-type MOSFET 81*a,* and a P-type well layer 83 included in an N-type MOSFET 81*b* adjacent to the P-type MOSFET 81*a.* The N-type well layer 82 and the P-type well layer 83 are provided so as to have a surface thereof at the same level. In the N-type well layer 82, a P-type layer 84 acting as a source region of the P-type MOSFET 81*a* and a P-type layer 86 acting as a drain region of the P-type MOSFET 81*a* are provided so as to have a surface thereof at the same level as the surface of the N-type well layer 82. A channel region 85 is between the P-type layer 84 and the P-type layer 86. In the P-type well layer 83 adjacent to the N-type well layer 82, an N-type layer 87 acting as a drain region of the N-type MOSFET 81*b* and an N-type layer 89 acting as a source region of the N-type MOSFET 81*b* are provided so as to have a surface thereof at the same level as the surface of the P-type well layer 83. A channel region 88 is between the N-type layer 87 and the N-type layer 89. The N-type well layer 82 and the P-type well layer 83 are covered with a continuous oxide layer 92. In the oxide layer 92, a gate electrode 90 of the P-type MOSFET 81*a* is provided above the channel region 85. Also in the oxide layer 92, a gate electrode 91 of the N-type MOSFET 81*b* is provided above the channel region 88.

According to the commonly used bulk process, devices such as, for example, a P-type MOSFET and an N-type MOSFET are provided so as to include a P-type well layer and an N-type well layer. Therefore, a large junction capacitance is generated in the source region and the drain region of each device. The large junction capacitance increases the current consumption and the delay time in signal propagation during the operation of each device. Similarly, according to the commonly used bulk process, the threshold voltage of the N-type MOSFET cannot be set to be lower than a prescribed level, the logical amplitude is reduced by the above-described voltage drop from the supply voltage level Vdd, which prevents realization of a low voltage operation.

Japanese Laid-Open Publication No. 10-135814 discloses an example of a pass transistor logic circuit including a pass transistor network, which is designed using an SOI (Silicon on Insulator) technology, and a buffer circuit.

FIGS. 20A and 20B each show an example of a pass transistor logic circuit disclosed in Japanese Laid-Open Publication No. 10-135814.

FIG. 20A shows a pass transistor logic circuit including an SOI-NMOS pass transistor network 71 and a buffer circuit 72 including CMOS inverters 72*a* and 72*b*. The SOI-NMOS pass transistor network 71 includes two N-type MOSFETs 71*a* and 71*b* having gates and bodies (a body corresponding to a substrate of a MOS structure using a bulk substrate) which are connected to each other as described below. The SOI-NMOS pass transistor network 71 determines logic synthesis.

The CMOS inverter 72*a* includes a P-type MOSFET 72*c* and an N-type MOSFET 72*d*. Gates of the P-type MOSFET 72*c* and the N-type MOSFET 72*d* are connected to each other, and bodies of the P-type MOSFET 72*c* and the N-type MOSFET 72*d* are connected to each other. The CMOS inverter 72*b* includes a P-type MOSFET 72*e* and an N-type MOSFET 72*f*. Gates of the P-type MOSFET 72*e* and the N-type MOSFET 72*f* are connected to each other, and bodies of the P-type MOSFET 72*e* and the N-type MOSFET 72*f* are connected to each other.

As described above, the SOI-NMOS pass transistor network 71 includes two N-type MOSFETs 71*a* and 71*b* which are connected in parallel through drains thereof. Sources of the N-type MOSFETs 71*a* and 71*b* are respectively connected to input terminals 75*a* and 75*b* of the SOI-NMOS pass transistor network 71. Gates of the N-type MOSFETs 71*a* and 71*b* are connected to an input terminal 75*c* of the SOI-NMOS pass transistor network 71. The drains of the N-type MOSFETs 71*a* and 71*b* which are connected to each other are respectively connected to an output terminal 76*a* and a complementary output terminal 76*b* of the SOI-NMOS pass transistor network 71.

The output terminal 76*a* of the SOI-NMOS pass transistor network 71 is connected to an input terminal of the CMOS inverter 72*a*. The complementary output terminal 76*b* of the SOI-NMOS pass transistor network 71 is connected to the input terminal of the CMOS inverter 72*b*.

FIG. 20B shows a pass transistor logic circuit including an SOI-NMOS pass transistor network 71 and a body-controlled PMOS feedback type buffer circuit 73. The SOI-NMOS pass transistor network 71 has the same structure as that shown in FIG. 20A.

The buffer circuit 73 includes a pair of P-type MOSFETs 73*a* and 73*c* and a pair of N-type MOSFETs 73*b* and 73*d*. A body of the P-type MOSFET 73*a* is connected to an output terminal 76*a* of the SOI-NMOS pass transistor network 71, and a body of the P-type MOSFET 73*c* is connected to a complementary output terminal 76*b* of the SOI-NMOS pass transistor network 71. Sources of the P-type MOSFETs 73*a* and 73*c* are connected to a power supply line, and drains of the P-type MOSFETs 73*a* and 73*c* are respectively connected to drains of the N-type MOSFETs 73*b* and 73*d*. Sources of the N-type MOSFETs 73*b* and 73*d* are grounded. A gate of the P-type MOSFET 73*a* is connected to a connection point between the P-type MOSFET 73*a* and the N-type MOSFET 73*d,* and a gate of the P-type MOSFET 73*c* is connected to a connection point between the P-type MOSFET 73*a* and the N-type MOSFET 73*b*. A gate of the N-type MOSFET 73*b* is connected to a body of the P-type MOSFET 73*a* and also connected to the output terminal 76*a*. A gate of the N-type MOSFET 73*d* is connected to a body of the P-type MOSFET 73*c* and also connected to the complementary output terminal 76*b*. Connection points between the P-type MOSFETs 73*a* and 73*c* respectively act as an output terminal or a complementary output terminal, or vice versa, of the buffer circuit 73.

The buffer circuits 72 and 73 respectively shown in FIGS. 20A and 20B control the body potentials of the P-type MOSFETs 73a and 73c and the N-type MOSFETs 73b and 73d, which are partially depleted SOI devices, so as to control the threshold voltage. Thus, the buffer circuits 72 and 73 suppress a shoot-through current flowing therein so as to reduce the current consumption.

FIG. 21 shows an exemplary CMOS inverter using an SOI technique.

The CMOS inverter includes a semiconductor substrate 93, and an oxide layer 94 having a prescribed thickness provided on the semiconductor substrate 93. In the oxide layer 94, P-type layers 95 and 97 are provided with a prescribed distance therebetween. N-type layers 98 and 100 are also provided in the oxide layer 94 with a prescribed distance therebetween. The P-type layers 95 and 97 and the N-type layers 98 and 100 are provided so as to have a surface thereof at the same level as a surface of the oxide layer 94. The P-type layers 95 and 97 are included in a P-type MOSFET 93a, and the N-type layers 98 and 100 are included in the N-type MOSFET 93b. A channel region formed of an N-type layer 96 between the P-type layers 95 and 97 acts as a body of the P-type MOSFET 93a, and a channel region formed of a P-type layer 99 between the N-type layers 98 and 100 acts as a body of the N-type MOSFET 93b. The N-type layer 96 and the P-type layer 99 also have a surface at the same level of the surface of the oxide layer 94.

The P-type layers 95 and 97, the N-type layer 96, the N-type layers 98 and 100, the P-type layer 99, and the oxide layer 94 are covered with a continuous oxide layer 103. In the oxide layer 103, a gate electrode 101 of the P-type MOSFET 93a is provided above the N-type layer 96. Also in the oxide layer 103, a gate electrode 102 of the N-type MOSFET 93b is provided above the P-type layer 99.

In such a CMOS inverter structure designed using the SOI technique, the P-type MOSFET 93a and the N-type MOSFET 93b are separated from the semiconductor substrate 93 by a prescribed distance corresponding to the thickness of the oxide layer 94. Therefore, a large junction capacitance, which is generated in a CMOS inverter designed by the bulk process, is not generated. The MOSFETs designed using the SOI technique can have a higher ratio between the ON current magnitude and the OFF current magnitude than in the MOSFETs designed by the bulk process. Therefore, the MOSFETs designed using the SOI technique have a steep sub-threshold characteristic and thus can be driven at a lower threshold voltage and have a shorter response time to a signal. A pass transistor logic circuit including devices designed with the SOI technique is capable of low voltage driving and high speed operation.

However, the buffer circuits 72 and 73 shown in FIGS. 20A and 20B have the following problems.

The buffer circuit 72 shown in FIG. 20A has the problems of, for example, the signal delay time being long and the current consumption being not reduced, like in the case of the pass transistor logic circuit shown in FIG. 17 designed by the bulk process.

The pass transistor logic circuit including the body-controlled PMOS feedback type buffer circuit 73 shown in FIG. 20B allows a signal exceeding the signal inversion level to be pulled up due to the circuit operation of the buffer circuit 73 and therefore can reduce the current consumption by suppressing the shoot-through current. However, the non-sharp shape of the signal waveform which is caused by the delay of the signal in the multi-stage pass transistor network cannot be alleviated.

SUMMARY OF THE INVENTION

A semiconductor integrated circuit according to the present invention includes a plurality of logical elements connected in series or parallel, the plurality of logical elements including a semiconductor substrate and an insulating layer provided on the semiconductor substrate; and a buffer circuit connected between a logical element group including at least two of the plurality of logical elements and another logical element group including at least two of the plurality of logical elements.

In one embodiment of the invention, the logical elements are N-type MOSFETs.

In one embodiment of the invention, the logical elements are P-type MOSFETs.

In one embodiment of the invention, the logical elements are CMOS transmission gates each including a P-type MOSFET and an N-type MOSFET.

In one embodiment of the invention, the buffer circuit is a CMOS inverter including a P-type MOSFET and an N-type MOSFET.

In one embodiment of the invention, the buffer circuit includes a P-type MOSFET and a CMOS inverter including a P-type MOSFET and an N-type MOSFET, a source of the P-type MOSFET is connected to a power supply line, and a drain and a gate of the P-type MOSFET are respectively connected to an input terminal and an output terminal of the CMOS inverter.

In one embodiment of the invention, the buffer circuit includes an N-type MOSFET and a CMOS inverter including a P-type MOSFET and an N-type MOSFET, a source of the N-type MOSFET is connected to a ground line, and a drain and a gate of the N-type MOSFET are respectively connected to an input terminal and an output terminal of the CMOS inverter.

In one embodiment of the invention, a threshold voltage of the P-type MOSFET is set to be a high level.

In one embodiment of the invention, a threshold voltage of the P-type MOSFET is set to be a high level.

In one embodiment of the invention, a threshold voltage of the N-type MOSFET is set to be a high level.

In one embodiment of the invention, a threshold voltage of the N-type MOSFET is set to be a high level.

In one embodiment of the invention, the buffer circuit is a non-inverter type buffer circuit including two inverter circuits connected in series.

In one embodiment of the invention, one of the inverter circuits of the non-inverter type buffer circuit is a buffer circuit including a CMOS inverter including a P-type MOSFET and an N-type MOSFET.

In one embodiment of the invention, one of the inverter circuits of the non-inverter type buffer circuit is a buffer circuit including a first P-type MOSFET and a CMOS inverter including a second P-type MOSFET and an N-type MOSFET, a source of the first P-type MOSFET is connected to a power supply line, and a drain and a gate of the first P-type MOSFET are respectively connected to an input terminal and an output terminal of the CMOS inverter.

In one embodiment of the invention, one of the inverter circuits of the non-inverter type buffer circuit is a buffer circuit including a first N-type MOSFET and a CMOS inverter including a P-type MOSFET and a second N-type MOSFET, a source of the first N-type MOSFET is connected to a ground line, and a drain and a gate of the first N-type MOSFET are respectively connected to an input terminal and an output terminal of the CMOS inverter.

Thus, the invention described herein makes possible the advantages of providing a semiconductor integrated circuit for suppressing non-sharpness of the waveform of a signal propagated through a pass transistor logic circuit so as to shorten the delay time.

These and other advantages of the present invention will become apparent to those skilled in the art upon reading and understanding the following detailed description with reference to the accompanying figures.

BRIEF DESCRIPTION OF THE DRAWINGS

FIG. 13 is a graph illustrating a delay characteristic of input and output voltages of the buffer circuit shown in FIG. 12;

FIG. 14 shows a structure of a non-inverter type buffer circuit usable for the present invention;

FIG. 15 is a table showing results of measuring the delay time and the current consumption of various combinations of a pass transistor network including six N-type MOSFETs or CMOS transmission gates connected in series, with an inserted intermediate buffer circuit;

DESCRIPTION OF THE PREFERRED EMBODIMENTS

Hereinafter, the present invention will be described by way of illustrative examples with reference to the accompanying drawings.

EXAMPLE 1

Figure 1A:
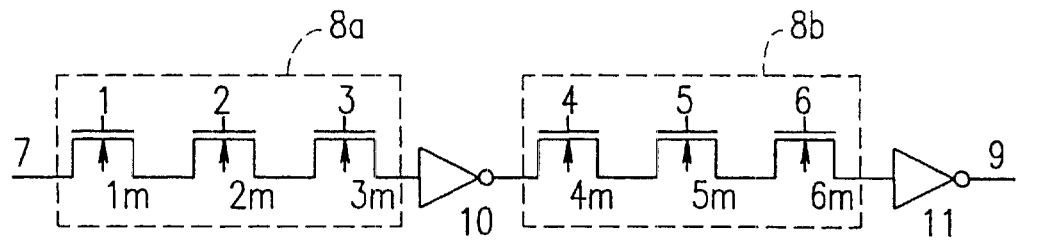
FIGS. 1A and 1B show a structure of a pass transistor logic circuit according to a first example of the present invention.
Figure 1B:
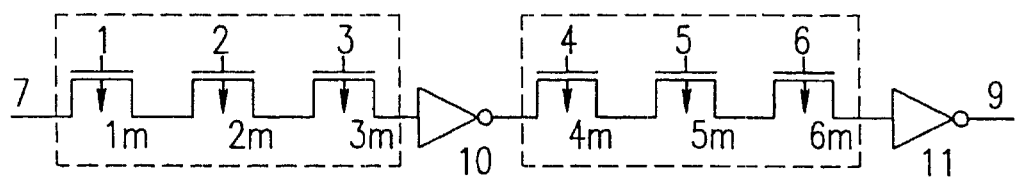

FIGS. 1A and 1B show a pass transistor logic circuit 110 according to a first example of the present invention. The pass transistor logic circuit 110 includes a first pass transistor network 8a, a first buffer circuit 10 connected to the first pass transistor network 8a, a second pass network 8b, and a second buffer circuit 11 connected to the second pass network 8b. An output terminal of the first buffer circuit 10 is connected in series to an input terminal of the second pass transistor network 8b.

The first pass transistor network 8a includes an SPL (single-rail pass transistor logic) circuit including three N-type MOSFETs 1m through 3m connected in series. The second pass transistor network 8b includes an SPL circuit including three N-type MOSFETs 4m through 6m connected in series. The N-type MOSFETs 1m through 6m each perform a logic operation.

The N-type MOSFETs 1m through 3m in the first pass transistor network 8a are connected in series through connection of a drain and a source of two adjacent MOSFETs. A drain of the third-stage N-type MOSFET 3m is connected to the input terminal of the first buffer circuit 10. Control input terminals 1 through 3 included in the first pass transistor network 8a are respectively connected to gates of the N-type MOSFETs 1m through 3m, and an input terminal 7 of the first pass transistor network 8a is connected to a source of the N-type MOSFET 1m.

A signal which is input to the input terminal 7 is processed in the first pass transistor network 8a with a prescribed logic operation based on signals applied to the control input terminals 1 through 3. The resultant signal is output from the drain of the N-type MOSFET 3m to the input terminal of the first buffer circuit 10. The signal is amplified and waveform-shaped by the first buffer circuit 10 and output from an output terminal of the first buffer circuit 10 to the input terminal of the second pass transistor network 8b.

The N-type MOSFETs 4m through 6m in the second pass transistor network 8b are connected in series through connection of a drain and a source of two adjacent MOSFETs. A drain of the third-stage N-type MOSFET 6m is connected to the input terminal of the second buffer circuit 11. Control input terminals 4 through 6 included in the second pass transistor network 8b are respectively connected to gates of the N-type MOSFETs 4m through 6m.

The signal which is output from the output terminal of the first buffer circuit 10 is input to the input terminal of the second pass transistor network 8b, i.e., a source of the N-type MOSFET 4m. The signal is then processed in the second pass transistor network 8b with a prescribed logic operation based on signals applied to the control input terminals 4 through 6. The resultant signal is output from the drain of the N-type MOSFET 6m to the input terminal of the second buffer circuit 11. The signal is amplified and waveform-shaped by the second buffer circuit 11 and output from an output terminal of the second buffer circuit 11 to an external circuit.

Figure 2:
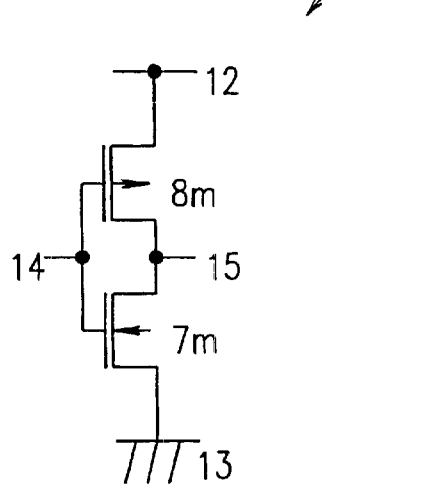
FIG. 2 shows a structure of a buffer circuit usable in the pass transistor logic circuit shown in FIG. 1.

FIG. 2 shows a specific configuration of a buffer circuit 150 which is usable as the first buffer circuit 10 or the second buffer circuit 11. The buffer circuit 150 includes a CMOS inverter including a P-type MOSFET 8m and an N-type MOSFET 7m which are formed using an SOI technique. The source of the P-type MOSFET 8m is connected to a power supply terminal 12, and a drain and a gate of the P-type MOSFET 8m are respectively connected to a drain and a gate of the N-type MOSFET 7m. A source of the N-type MOSFET 7m is connected to a GND line 13 (i.e., grounded).

The gates of the P-type MOSFET 8*m* and the N-type MOSFET 7*m* correspond to an input terminal 14 of the buffer circuit 150, and the drains of the P-type MOSFET 8*m* and the N-type MOSFET 7*m* correspond to an output terminal 15 of the buffer circuit 150.

The P-type MOSFET 8*m* and the N-type MOSFET 7*m*, which are formed using the SOI technique as described above, have a steep sub-threshold characteristic and thus can be driven at a lower threshold voltage. Therefore, the buffer circuit 150 including the P-type MOSFET 8*m* and the N-type MOSFET 7*m* is capable of low voltage driving.

Figure 3:
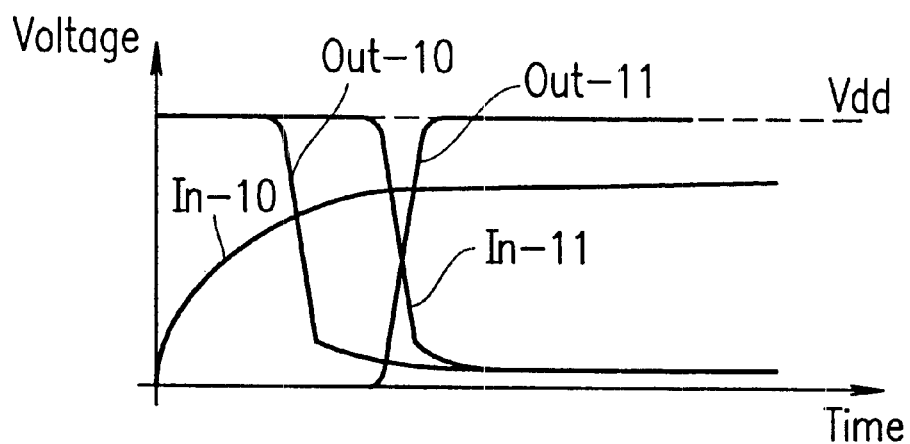
FIG. 3 is a graph illustrating a delay characteristic of input and output voltages of the buffer circuit shown in FIG. 2.

FIG. 3 is a graph illustrating a delay characteristic of input and output voltages of the first buffer circuit 10 and the second buffer circuit 11 of the pass transistor logic circuit 110 shown in FIG. 1. As each of the first buffer circuit 10 and the second buffer circuit 11, the buffer circuit 150 shown in FIG. 2 is used. The horizontal axis represents time, and the vertical axis represents the input/output voltage. An input voltage In-10 shown in FIG. 3 represents a voltage of a signal which is input to the input terminal 7 of the first pass transistor network 8*a*. The input voltage In-10, which periodically changes from a LOW level to a HIGH level, passes through the three N-type MOSFETs 1*m* through 3*m* connected in series and then is input to the input terminal of the first buffer circuit 10. An output voltage Out-10 represents a voltage of the signal which is output from the output terminal of the first buffer circuit 10. The input voltage In-10 increases from the ground level GND to the supply voltage level Vdd over-time. The output voltage Out-10 is obtained by inversion performed by the CMOS inverter included in the first buffer circuit 10, and thus decreases from the supply voltage level Vdd to a level representing an OFF state.

The first pass transistor network 8*a* includes three N-type MOSFETs 1*m* through 3*m*. Therefore, when the input voltage of the first buffer circuit 10 changes from the LOW level to the HIGH level, the voltage level does not rise to the supply voltage level Vdd but rises only to a voltage level which is lower than the supply voltage level Vdd by a threshold voltage of the N-type MOSFETs 1*m* through 3*m*. The input voltage In-10 increases over-time, and the drain-source voltage and the gate-source voltage of each of the N-type MOSFETs 1*m* through 3*m* decrease. Therefore, the amplification degree of each of the N-type MOSFETs 1*m* through 3*m* approaches an OFF region (saturation region), and the gradient of rise of the input voltage of the first buffer circuit 10 from the LOW level to the HIGH level is slower. Since the first pass transistor network 8*a* includes three N-type MOSFETs 1*m* through 3*m*, as opposed to six N-type MOSFETs in the conventional pass transistor network 80 shown in FIG. 17, the first pass transistor network 8*a* has a shorter delay time than the conventional pass transistor network 80 and thus the influence of the delay time on the gradient of the rise of the input voltage In-10 to the first buffer circuit 10 from the LOW level to the HIGH level is alleviated. As described above, the input voltage In-10 is input to the input terminal of the first buffer circuit 10, and the output voltage Out-10 is output from the output terminal of the first buffer circuit 10. The output voltage Out-10 is waveform-shaped by the first buffer circuit 10 and thus exhibits a steep transit characteristic.

The output voltage Out-10 is input to the source of the N-type MOSFET 4*m* of the second pass transistor network 8*b*. The output voltage Out-10, which changes from a HIGH level to a LOW level, passes through the three N-type MOSFETs 4*m* through 6*m* connected in series and then is input to the input terminal of the second buffer circuit 11 as an input voltage In-11. In the N-type MOSFETs 4*m* through 6*m*, the signal voltage is transmitted from the source (input) to the drain (output) thereof. Therefore, the output voltage Out-10 is transmitted from the input terminal to the output terminal of the second pass transistor network 8*b* in the same phase, i.e., without being inverted. In addition, since the signal is changed from the HIGH level to the LOW level, the gate-source voltage does not change. Therefore, the gradient of the fall from the HIGH level to the LOW level is not slow. As a result, the input voltage In-11 is input to the second buffer circuit 11 in the same phase as the output voltage Out-10 although the waveform is made non-sharp by the delay caused while the output voltage Out-10 passes through the N-type MOSFETs 4*m* through 6*m*. The input voltage In-11 is amplified and waveform-shaped in the second buffer circuit 11 and then output to an external circuit as an output voltage Out-11 having a steep rise characteristic.

As described above, the pass transistor logic circuit 110 shown in FIG. 1 includes the first buffer circuit 10 between three N-type MOSFET 1*m* through 3*m* connected in series and three N-type MOSFET 4*m* through 6*m* connected in series. Due to such a structure, the pass transistor logic circuit 110 causes the rise and fall of the signal voltage output from the second buffer circuit 11 to be steeper than in the conventional pass transistor logic circuit shown in FIG. 17. Therefore, the non-sharpness of the signal waveform during the transition time is alleviated. As a result, the pass transistor logic circuit 110 shown in FIG. 1 shortens the signal delay time so as to increase the speed of signal voltage transmission and also suppresses the shoot-through current so as to reduce the current consumption.

As described above, in a pass transistor logic circuit including a pass transistor network which includes multi-stage devices, such as N-type MOSFETs, connected in series, a buffer circuit can be inserted every appropriate number of devices in consideration of the characteristics of the devices. In this way, the non-sharpness of the signal transmission characteristic is alleviated, and the current consumption is reduced.

In the buffer circuit 150 (FIG. 2) usable in the pass transistor logic circuit 110 according to the present invention, the devices such as P-type MOSFET 8*m* and the N-type MOSFETs 1*m* through 7*m* have a structure designed using the SOI technique. Therefore, the junction capacitance in the source region and the drain region, which acts as the load capacitance of the buffer circuit 150, is very small. Such a small junction capacitance allows the rise and fall of the output voltage of the buffer circuit 150 to be sufficiently steep to increase the speed of signal voltage transmission and reduce the current consumption. Such a small junction capacitance also eliminates the necessity of the P-type well layer and the N-type well layer, which are necessary when a bulk process is used. Thus, even when a buffer circuit is added to the conventional structure, an increase in the area of the additional buffer circuit on the substrate is restricted to be minimal.

EXAMPLE 2

Figure 4:
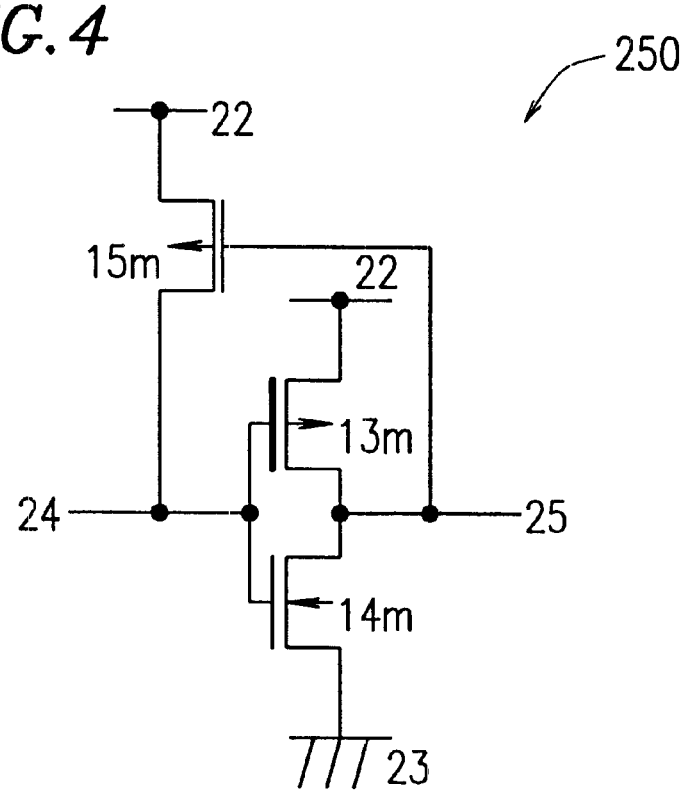
FIG. 4 shows a structure of a buffer circuit according to a second example of the present invention.

FIG. 4 shows a specific configuration of a buffer circuit 250, according to a second example of the present invention, which is usable as the first buffer circuit 10 or the second buffer circuit 11. The buffer circuit 250 includes a CMOS inverter including a P-type MOSFET 13*m* having a high threshold voltage and an N-type MOSFET 14*m* both formed using an SOI technique, and a pull-up P-type MOSFET 15*m*. A source of the P-type MOSFET 13*m* is connected to a power supply line 22, and a drain and a gate of the P-type MOSFET 13m are respectively connected to a drain and a gate of the N-type MOSFET 14m. A source of the N-type MOSFET 14m is connected to a GND line 23 (i.e., grounded). The gates of the P-type MOSFET 13m and the N-type MOSFET 14m correspond to an input terminal 24 of the buffer circuit 250, and the drains of the P-type MOSFET 13m and the N-type MOSFET 14m correspond to an output terminal 25 of the buffer circuit 250. A source of the P-type MOSFET 15m is connected to the power supply line 22. A gate of the P-type MOSFET 15m is connected to the output terminal 25, and a drain of the type MOSFET 15m is connected to the input terminal 24. The "high threshold voltage" of the P-type MOSFET 13m is higher than the threshold voltage of other MOSFETs formed using an SOI technique, but is significantly lower than the threshold voltage of MOSFETs formed using a bulk process.

Figure 5:
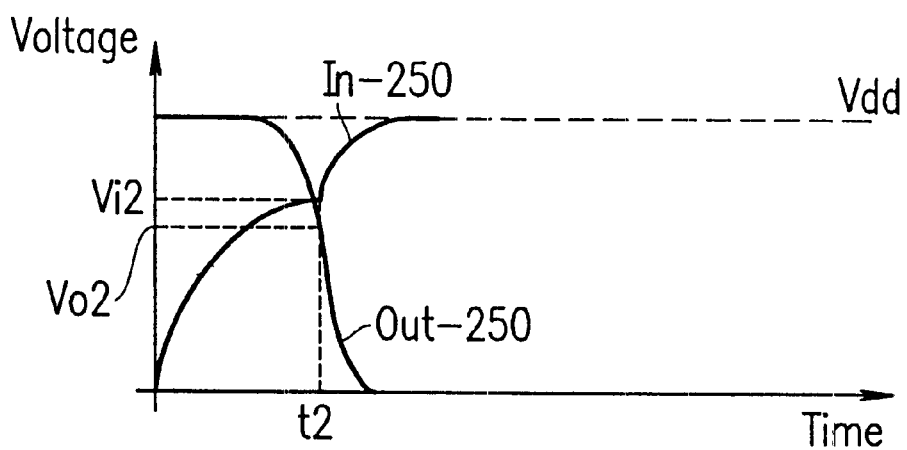
FIG. 5 is a graph illustrating a delay characteristic of input and output voltages of the buffer circuit shown in FIG. 4.

FIG. 5 is a graph illustrating a delay characteristic of input and output voltages of the buffer circuit 250 used as the first buffer circuit 10 shown in FIG. 1. The horizontal axis represents time, and the vertical axis represents the input/output voltage. An input voltage In-250 shown in FIG. 5 represents a voltage of a signal which is input to the input terminal 7 of the first pass transistor network 8a. The input voltage In-250, which periodically changes from a LOW level to a HIGH level, passes through the three N-type MOSFETs 1m through 3m connected in series and then is input to the input terminal 24 of the buffer circuit 250. An output voltage Out-250 represents a voltage of the signal which is output from the output terminal 25 of the buffer circuit 250. The input voltage In-250 increases from the ground level GND to the supply voltage level Vdd overtime. The output voltage Out-250 is obtained by inversion performed by the CMOS inverter included in the buffer circuit 250, and thus decreases from the supply voltage level Vdd to a level representing an OFF state.

The first pass transistor network 8a includes three N-type MOSFETs 1m through 3m. Therefore, when the input voltage of the buffer circuit 250 changes from the LOW level to the HIGH level, the voltage level does not rise to the supply voltage level Vdd but rises only to a voltage level which is lower than the supply voltage level Vdd by a threshold voltage of the N-type MOSFETs 1m through 3m. The input voltage In-250 increases over-time, and the drain-source voltage and the gate-source voltage of each of the N-type MOSFETs 1m through 3m decrease. Therefore, the amplification degree of each of the N-type MOSFETs 1m through 3m approaches an OFF region (saturation region), and the gradient of rise of the input voltage of the buffer circuit 250 from the LOW level to the HIGH level is slower.

When the input voltage In-250 becomes Vi2 at time t2, the output voltage Out-250 at the output terminal 25 decreases from the supply voltage level Vdd by a threshold voltage of the P-MOSFET to a level Vo2. In the case where the output voltage level Vo2 is lower than the power supply voltage Vdd by the threshold voltage of the P-type MOSFET 15m, the P-type MOSFET 15m is turned ON, and the input voltage In-250 is raised to the supply voltage level Vdd (i.e., pulled up). The pulled-up voltage In-250 is input to the buffer circuit 250, and a signal having the output voltage Out-250 is output from the output terminal 25 of the buffer circuit 250.

As described above, the buffer circuit 250 shown in FIG. 4 provides the pull-up effect of raising the input voltage level of the P-type MOSFET 15m to the power supply voltage Vdd. The pull-up effect suppresses the shoot-through current so as to reduce the current consumption. The pull-up effect also alleviates the non-sharpness of the signal waveform during the transition time, and as a result shortens the signal delay time.

In the second example, the cut-off characteristic provided by the high threshold voltage of the P-type MOSFET 13m suppresses the leak current while the signal level does not change even without inserting a transistor between the buffer circuit 250 and the power supply and setting a stand-by mode in which the buffer circuit 250 is forcibly turned OFF while the buffer circuit 250 is in a stand-by state.

EXAMPLE 3

Figure 6:
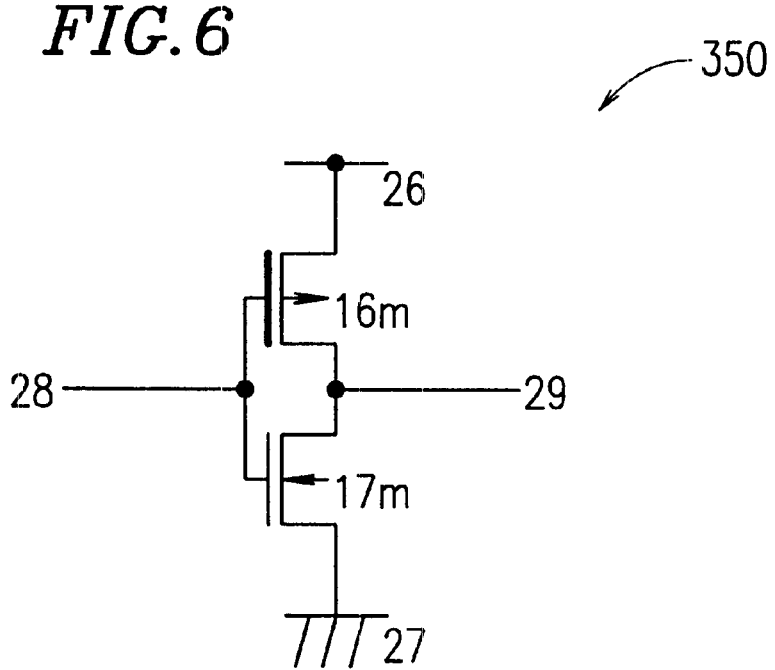
FIG. 6 shows a structure of a buffer circuit according to a third example of the present invention.

FIG. 6 shows a specific configuration of still another buffer circuit 350, according to a third example of the present invention, which is usable as the first buffer circuit 10 or the second buffer circuit 11. The buffer circuit 350 includes a CMOS inverter including a P-type MOSFET 16m having a high threshold voltage and an N-type MOSFET 17m both formed using an SOI technique. A source of the P-type MOSFET 16m is connected to a power supply line 26, and a drain and a gate of the P-type MOSFET 16m are respectively connected to a drain and a gate of the N-type MOSFET 17m. A source of the N-type MOSFET 17m is connected to a GND line 27 (i.e., grounded). The gates of the P-type MOSFET 16m and the N-type MOSFET 17m correspond to an input terminal 28 of the buffer circuit 350, and the drains of the P-type MOSFET 16m and the N-type MOSFET 17m correspond to an output terminal 29 of the buffer circuit 350.

Figure 7:
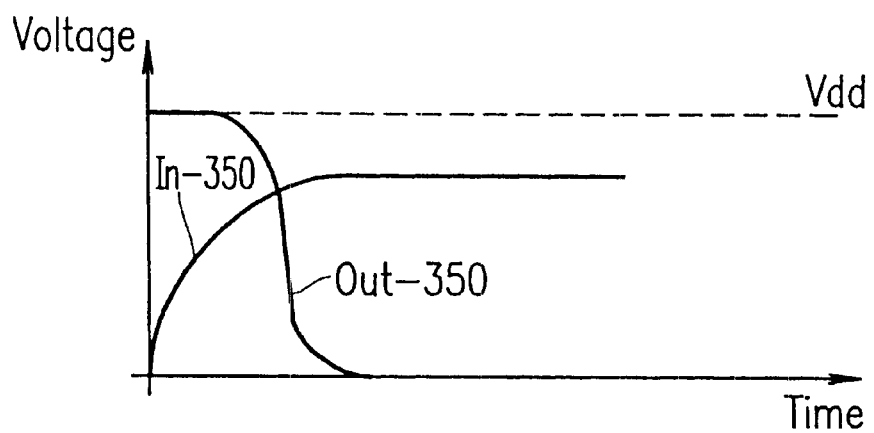
FIG. 7 is a graph illustrating a delay characteristic of input and output voltages of the buffer circuit shown in FIG. 6.

FIG. 7 is a graph illustrating a delay characteristic of input and output voltages of the buffer circuit 350 used as the first buffer circuit 10 shown in FIG. 1. The horizontal axis represents time, and the vertical axis represents the input/output voltage. An input voltage In-350 shown in FIG. 7 represents a voltage of a signal which is input to the input terminal 7 of the first pass transistor network 8a. The input voltage In-350, which periodically changes from a LOW level to a HIGH level, passes through the three N-type MOSFETs 1m through 3m connected in series and then is input to the input terminal 28 of the buffer circuit 350. An output voltage Out-350 represents a voltage of the signal which is output from the output terminal 29 of the buffer circuit 350. The input voltage In-350 increases from the ground level GND to the supply voltage level Vdd overtime. The output voltage Out-350 is obtained by inversion performed by the CMOS inverter included in the buffer circuit 350, and thus decreases from the supply voltage level Vdd to a level representing an OFF state.

The first pass transistor network 8a includes three N-type MOSFETs 1m through 3m. Therefore, when the input voltage of the buffer circuit 350 changes from the LOW level to the HIGH level, the voltage level does not rise to the supply voltage level Vdd but rises only to a voltage level which is lower than the supply voltage level Vdd by a threshold voltage of the N-type MOSFETs 1m through 3m. The input voltage In-350 increases over-time, and the drain-source voltage and the gate-source voltage of each of the N-type MOSFETs 1m through 3m decrease. Therefore, the amplification degree of each of the N-type MOSFETs 1m through 3m approaches an OFF region (saturation region), and the gradient of rise of the input voltage of the buffer circuit 350 from the LOW level to the HIGH level is slower.

As described above, the P-type MOSFET 16m has a high threshold voltage. Therefore, the input voltage In-350, which rises only to a voltage level which is lower than the supply voltage level Vdd by a threshold voltage of the N-type MOSFETs 1m through 3m, still exceeds a level which is lower than the power supply level Vdd by the high threshold voltage of the P-type MOSFET 16m. As a consequence, the P-type MOSFET 16m enters a completely OFF state. Thus, the shoot-through current in the buffer circuit 350 is suppressed, and the current consumption is reduced.

In the third example also, the cut-off characteristic provided by the high threshold voltage of the P-type MOSFET 16m suppresses the leak current while the signal level does not change even without inserting a transistor between the buffer circuit 350 and the power supply and setting a stand-by mode in which the buffer circuit 350 is forcibly turned OFF while the buffer circuit 350 is in a stand-by state.

In the first through third examples, the first pass transistor network 8a and the second pass transistor network 8b included in the pass transistor logic circuit are both N-type MOSFETs. Alternatively, the first pass transistor network 8a and the second pass transistor network 8b may be P-type MOSFETs. In this case also, the speed of signal voltage transmission is improved and the current consumption is reduced by inserting a buffer circuit between the first pass transistor network 8a and the second pass transistor network 8b.

In the structure where the first pass transistor network 8a and the second pass transistor network 8b are P-type MOSFETs, the voltages are inverted to the voltages in the structure where the first pass transistor network 8a and the second pass transistor network 8b are N-type MOSFETs. Therefore, the signal voltage transmission when the input voltage is at a LOW level is in a critical situation, as opposed to the case where the N-type MOSFETs are used. More specifically, the voltage level of the input signal does not fall to the ground level GND but only falls to a level which is higher than the ground level GND by the threshold voltage of the P-type MOSFETs. This is solved by adding a buffer circuit and changing the combination of the devices in the buffer circuit, so that an effect which is similar to the effect provided when the N-type MOSFETs are used is provided.

EXAMPLE 4

Figure 8:
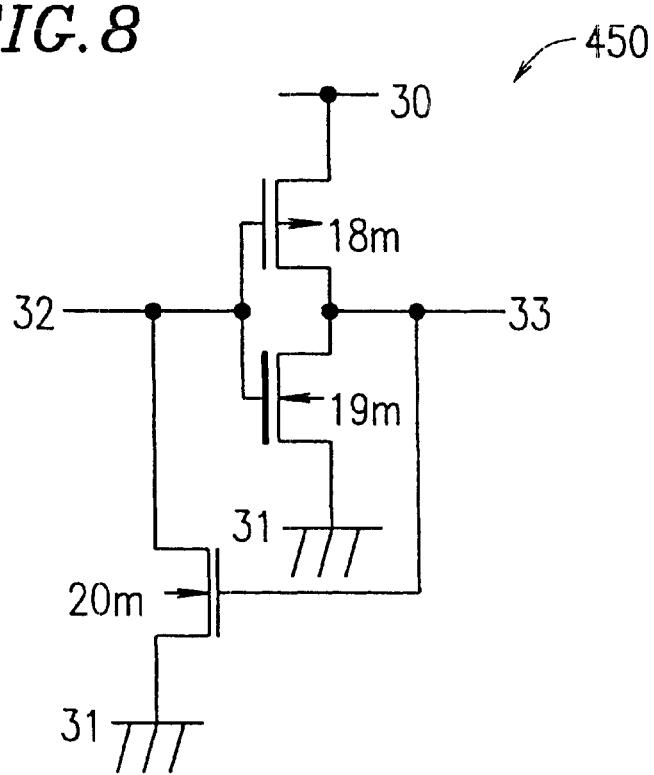
FIG. 8 shows a structure of a buffer circuit according to a fourth example of the present invention.

FIG. 8 shows a specific configuration of still another buffer circuit 450, according to a fourth example of the present invention, which is usable as the first buffer circuit 10 or the second buffer circuit 11. The buffer circuit 450 is used when the N-type MOSFETs 1m through 6m in the first and second pass transistor network 8a and 8b shown in FIG. 1 are replaced with P-type MOSFETs. The buffer circuit 450 includes a CMOS inverter including a P-type MOSFET 18m and an N-type MOSFET 19m having a high threshold voltage both formed using an SOI technique, and a pull-down N-type MOSFET 20m. A source of the P-type MOSFET 18m is connected to a power supply line 30, and a drain and a gate of the P-type MOSFET 18m are respectively connected to a drain and a gate of the N-type MOSFET 19m. A source of the N-type MOSFET 19m is connected to a GND line 31 (i.e., grounded). The gates of the P-type MOSFET 18m and the N-type MOSFET 19m correspond to an input terminal 32 of the buffer circuit 450, and the drains of the P-type MOSFET 18m and the N-type MOSFET 19m correspond to an output terminal 32 of the buffer circuit 450. A source of the N-type MOSFET 20m is connected to the GND line 31 (i.e., grounded). A gate of the N-type MOSFET 20m is connected to the output terminal 33, and a drain of the N-type MOSFET 20m is connected to the input terminal 32.

Figure 9:
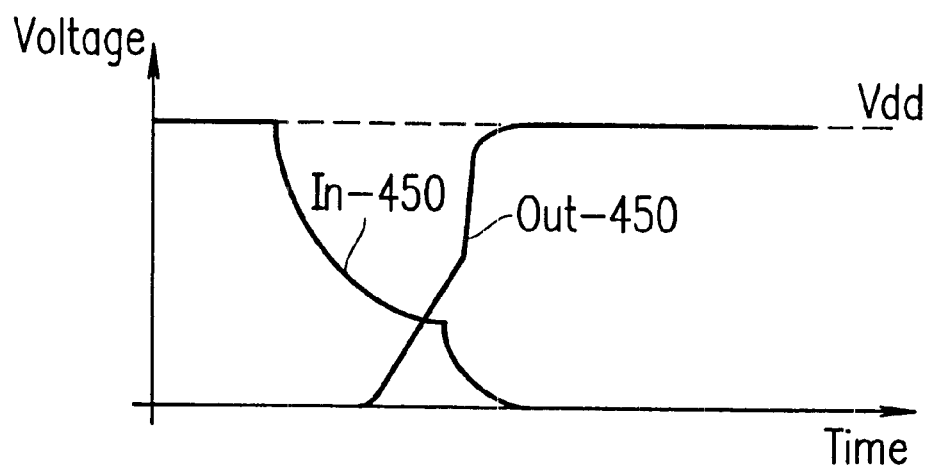
FIG. 9 is a graph illustrating a delay characteristic of input and output voltages of the buffer circuit shown in FIG. 8.

FIG. 9 is a graph illustrating a delay characteristic of input and output voltages of the buffer circuit 450 used as the first buffer circuit 10 shown in FIG. 1. The horizontal axis represents time, and the vertical axis represents the input/output voltage. An input voltage In-450 shown in FIG. 9 represents a voltage of a signal which is input to the input terminal 7 of the first pass transistor network 8a. The input voltage In-450, which periodically changes from a HIGH level to a LOW level, passes through the three P-type MOSFETs connected in series and then is input to the input terminal 32 of the buffer circuit 450. An output voltage Out-450 represents a voltage of the signal which is output from the output terminal 33 of the buffer circuit 450. The input voltage In-450 decreases from the supply voltage level Vdd to a level representing an OFF state. The output voltage Out-450 is obtained by inversion performed by the CMOS inverter included in the buffer circuit 450, and thus increases from the level representing an OFF state to the supply voltage level Vdd.

The first pass transistor network 8a includes three P-type MOSFETs. Therefore, when the input voltage of the buffer circuit 450 changes from the HIGH level to the LOW level, the voltage level does not fall to the ground level GND but falls only to a voltage level which is higher than the ground level GND by a threshold voltage of the P-type MOSFETs. The input voltage In-450 decreases over-time, and the drain-source voltage and the gate-source voltage of each of the P-type MOSFETs decrease. Therefore, the amplification degree of each of the P-type MOSFETs approaches an OFF region (saturation region), and the gradient of fall of the input voltage of the buffer circuit 450 from the HIGH level to the LOW level is slower.

After a certain length of time, the output voltage Out-450 obtained by inversion of the input voltage level is output form the output terminal 33 of the buffer circuit 450. In the case where the output voltage Out-450 is higher than the ground level GND by the threshold voltage of the N-type MOSFET 20m, the N-type MOSFET 20m is turned ON, and the input voltage In-450 is dropped to the ground level GND (i.e., pulled down). The pulled-down voltage In-450 is input to the buffer circuit 450, and a signal having the output voltage Out-450 is output from the output terminal 33 of the buffer circuit 450.

As described above, the buffer circuit 450 shown in FIG. 8 provides the pull-down effect of dropping the input voltage level of the N-type MOSFET 20m to the ground level GND. The pull-down effect suppresses the shoot-through current so as to reduce the current consumption. The pull-down effect also alleviates the non-sharpness of the signal waveform during the transition time, and as a result shortens the signal delay time.

In the fourth example, the cut-off characteristic provided by the high threshold voltage of the N-type MOSFET 19m suppresses the leak current while the signal level does not change even without inserting a transistor between the buffer circuit 450 and the power supply and setting a stand-by mode in which the buffer circuit 450 is forcibly turned OFF while the buffer circuit 450 is in a stand-by state.

EXAMPLE 5

Figure 10:
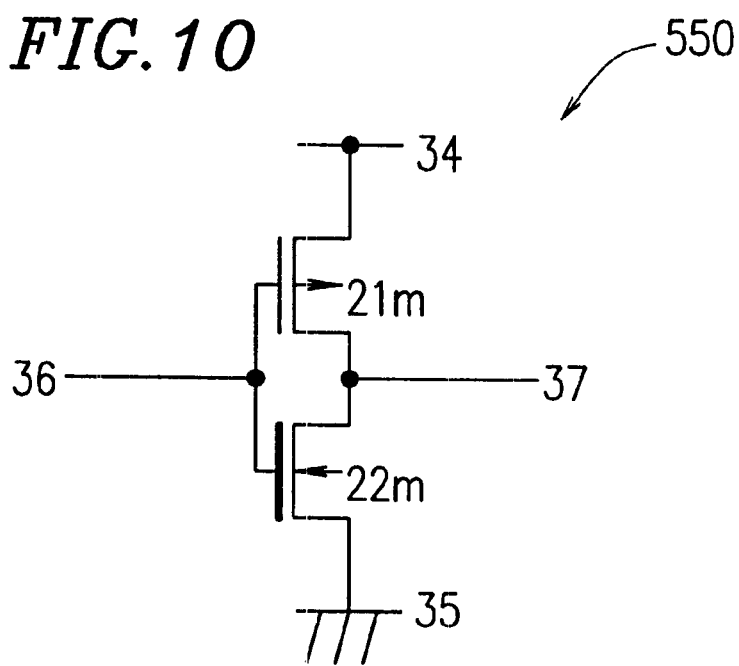
FIG. 10 shows a structure of a buffer circuit according to a fifth example of the present invention.

FIG. 10 shows a specific configuration of still another buffer circuit 550, according to a fifth example of the present invention, which is usable as the first buffer circuit 10 or the second buffer circuit 11. The buffer circuit 550 is used when the N-type MOSFETs 1m through 6m in the first and second pass transistor network 8a and 8b shown in FIG. 1 are replaced with P-type MOSFETs. The buffer circuit 550 includes a CMOS inverter including a P-type MOSFET 21m and an N-type MOSFET 22m having a high threshold voltage both formed using an SOI technique. A source of the P-type MOSFET 21*m* is connected to a power supply line 34, and a drain and a gate of the P-type MOSFET 21*m* are respectively connected to a drain and a gate of the N-type MOSFET 22*m*. A source of the N-type MOSFET 22*m* is connected to a GND line 35 (i.e., grounded). The gates of the P-type MOSFET 21*m* and the N-type MOSFET 22*m* correspond to an input terminal 36 of the buffer circuit 550, and the drains of the P-type MOSFET 21*m* and the N-type MOSFET 22*m* correspond to an output terminal 37 of the buffer circuit 550.

Figure 11:
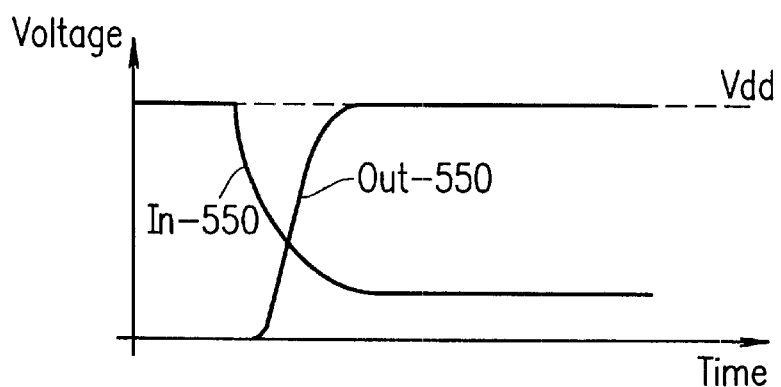
FIG. 11 is a graph illustrating a delay characteristic of input and output voltages of the buffer circuit shown in FIG. 10.

FIG. 11 is a graph illustrating a delay characteristic of input and output voltages of the buffer circuit 550 used as the first buffer circuit 10 shown in FIG. 1. The horizontal axis represents time, and the vertical axis represents the input/output voltage. An input voltage In-550 shown in FIG. 11 represents a voltage of a signal which is input to the input terminal 7 of the first pass transistor network 8*a*. The input voltage In-550, which periodically changes from a HIGH level to a LOW level, passes through the three P-type MOSFETs connected in series and then is input to the input terminal 36 of the buffer circuit 550. An output voltage Out-550 represents a voltage of the signal which is output from the output terminal 37 of the buffer circuit 550. The input voltage In-550 decreases from the supply voltage level Vdd to a level representing an OFF state over-time. The output voltage Out-550 is obtained by inversion performed by the CMOS inverter included in the buffer circuit 550, and thus increases from the level representing an OFF state to the supply voltage level Vdd.

The first pass transistor network 8*a* includes three P-type MOSFETs. Therefore, when the input voltage of the buffer circuit 550 changes from the HIGH level to the LOW level, the voltage level does not fall to the ground level GND but falls only to a voltage level which is higher than the ground level GND by a threshold voltage of the P-type MOSFETs. The input voltage In-450 decreases over-time, and the drain-source voltage and the gate-source voltage of each of the P-type MOSFETs decrease. Therefore, the amplification degree of each of the Ptype MOSFETs approaches an OFF region (saturation region), and the gradient of fall of the input voltage of the buffer circuit 550 from the HIGH level to the LOW level is slower.

As described above, the N-type MOSFET 22*m* has a high threshold voltage. Therefore, the input voltage In-550, which falls only to a voltage level which is higher than the ground level GND by a threshold voltage of the P-type MOSFETs, is lower than the high threshold voltage of the N-type MOSFET 22*m*. As a consequence, the N-type MOSFET 22*m* enters a completely OFF state. Thus, the shoot-through current in the buffer circuit 550 is suppressed, and the current consumption is reduced.

In the fifth example also, the cut-off characteristic provided by the high threshold voltage of the N-type MOSFET 22*m* suppresses the leak current while the signal level does not change even without inserting a transistor between the buffer circuit 550 and the power supply and setting a stand-by mode in which the buffer circuit 550 is forcibly turned OFF while the buffer circuit 550 is in a stand-by state.

EXAMPLE 6

Figure 12:
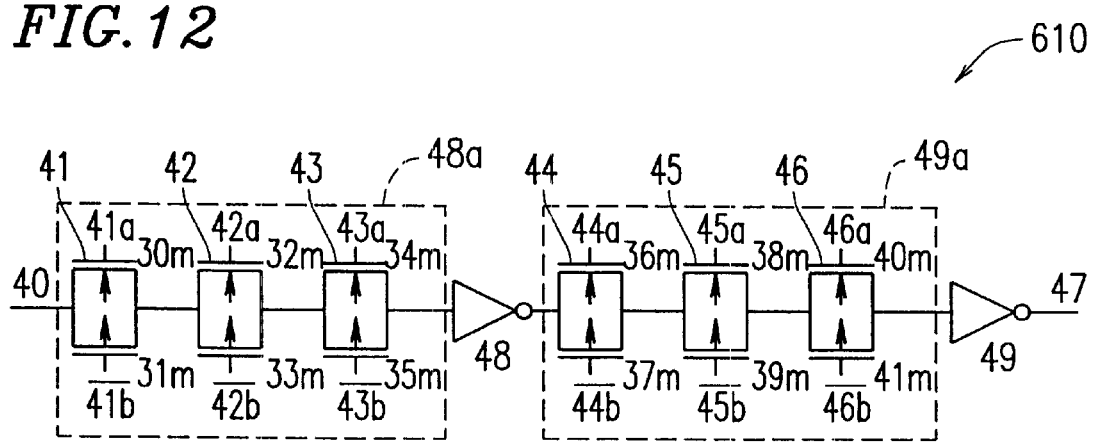
FIG. 12 shows a structure of a pass transistor logic circuit according to a sixth example of the present invention.
Figure 16:
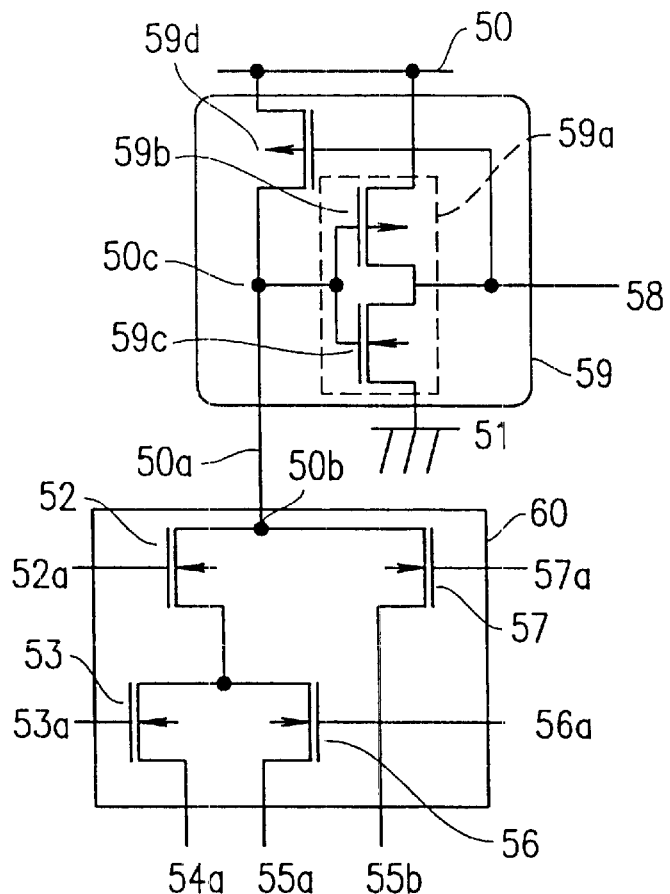
FIG. 16 shows a conventional pass transistor logic circuit.

FIG. 12 shows a pass transistor logic circuit 610 according to a sixth example of the present invention. The pass transistor logic circuit 610 includes a first pass transistor network 48*a* and a second pass transistor network 49*a* each including CMOS transmission gates.

The pass transistor logic circuit 610 includes a first pass transistor network 48*a*, a first buffer circuit 48 connected to the first pass transistor network 48*a*, a second pass transistor network 49*a*, and a second buffer circuit 49 connected to the second pass transistor network 49*a*. An output terminal of the first buffer circuit 48 is connected in series to an input terminal of the second pass transistor network 49*a*.

The first pass transistor network 48*a* includes an SPL (single-rail pass transistor logic) circuit including three CMOS transmission gates 41 through 43 connected in series. The second pass transistor network 49*a* includes an SPL circuit including three CMOS transmission gates 44 through 46 connected in series. The CMOS transmission gates 41 through 46 each perform a logic operation.

The first pass transistor network 48*a* has the following structure. The CMOS transmission gate 41 includes an N-type MOSFET 30*m* and a P-type MOSFET 31*m*. The CMOS transmission gate 42 includes an N-type MOSFET 32*m* and a P-type MOSFET 33*m*. The CMOS transmission gate 43 includes an N-type MOSFET 34*m* and a P-type MOSFET 35*m*. Drains of the N-type MOSFET and the P-type MOSFET of each CMOS transmission gate 41, 42, 43 are connected to each other, and sources of each CMOS transmission gate 41, 42, 43 are also connected to each other. The sources act as an input terminal of the respective CMOS transmission gate, and the drains act as an output terminal of the respective CMOS transmission gate.

The CMOS transmission gates 41 through 43 are connected in series through connection of a drain and a source of two adjacent CMOS transmission gates. A drain of the third-stage CMOS transmission gate 43 is connected to an input terminal of the first buffer circuit 48. Control input terminals 41*a*, 42*a* and 43*a* included in the first pass transistor network 48*a* are respectively connected to gates of the N-type MOSFETs 30*m*, 32*m* and 34*m* of the CMOS transmission gate 41, 42 and 43. Control inversion input terminals 41*b*, 42*b* and 43*b* included in the first pass transistor network 48*a* are respectively connected to gates of the P-type MOSFETs 31*m*, 33*m* and 35*m* of the CMOS transmission gate 41, 42 and 43. An input terminal 40 of the first pass transistor network 48*a* is connected to the source of the CMOS transmission gate 41.

A signal which is input to the input terminal 40 of the first pass transistor network 48*a* is processed in the first pass transistor network 48*a* with a prescribed logic operation based on signals applied to the control input terminals 41*a* through 43*a* and the control inversion input terminals 41*b* through 43*b*. The resultant signal is output from the drain of the CMOS transmission gate 43 to an input terminal of the first buffer circuit 48 as a logic operation signal. The logic operation signal is amplified and waveform-shaped by the first buffer circuit 48 and output from an output terminal of the first buffer circuit 48 to an input terminal of the second pass transistor network 49*a*, i.e., a source of the CMOS transmission gate 44.

The second pass transistor network 49*a* has the following structure. The CMOS transmission gate 44 includes an N-type MOSFET 36*m* and a P-type MOSFET 37*m*. The CMOS transmission gate 45 includes an N-type MOSFET 38*m* and a P-type MOSFET 39*m*. The CMOS transmission gate 46 includes an N-type MOSFET 40*m* and a P-type MOSFET 41*m*. Drains of the N-type MOSFET and the P-type MOSFET of each CMOS transmission gate 44, 45, 46 are connected to each other, and sources of each CMOS transmission gate 44, 45, 46 are also connected to each other. The sources act as an input terminal of the respective CMOS transmission gate, and the drains act as an output terminal of the respective CMOS transmission gate.

The CMOS transmission gates 44 through 46 are connected in series through connection of a drain and a source of two adjacent CMOS transmission gates. A drain of the third-stage CMOS transmission gate 46 is connected to an input terminal of the second buffer circuit 49. Control input terminals 44a, 45a and 46a included in the second pass transistor network 49a are respectively connected to gates of the N-type MOSFETs 36m, 38m and 40m of the CMOS transmission gates 44, 45 and 46. Control inversion input terminals 44b, 45b and 46b included in the second pass transistor network 49a are respectively connected to gates of the P-type MOSFETs 37m, 39m and 41m of the CMOS transmission gates 44, 45 and 46.

The logic operation signal which is input to the input terminal 40 of the second pass transistor network 49a from the source of the CMOS transmission gate 44 of the first pass transistor network 48a is processed in the second pass transistor network 49a with a prescribed logic operation based on signals applied to the control input terminals 44a through 46a and the control inversion input terminals 44b through 46b. The resultant signal is output from the drain of the CMOS transmission gate 46 to an input terminal of the second buffer circuit 49 as the logic operation signal. The logic operation signal is amplified and waveform-shaped by the second buffer circuit 49 and output from an output terminal of the second buffer circuit 49 to an external circuit.

The first buffer circuit 48 and the second buffer circuit 49 can be formed of any of the circuits shown in FIGS. 2, 4, 6, 8 and 10. The P-type MOSFETs and the N-type MOSFETs included in these circuits are formed using an SOI technique and therefore have a steep sub threshold characteristic. As a result, the threshold voltage can be set to be lower than usual, which realizes low voltage driving of a buffer circuit including the P-type MOSFETs and the N-type MOSFETs.

FIG. 13 is a graph illustrating a delay characteristic of input and output voltages of the first buffer circuit 10 and the second buffer circuit 11 of the pass transistor logic circuit 610 shown in FIG. 12. The horizontal axis represents time, and the vertical axis represents the input/output voltage. An input voltage In-48 shown in FIG. 13 represents a voltage of a signal which is input to the input terminal 40 of the first pass transistor network 48a. The input voltage In-48, which periodically changes from a LOW level to a HIGH level, passes through the three CMOS transmission gate 41 through 43 connected in series and then is input to the input terminal of the first buffer circuit 48. An output voltage Out-48 represents a voltage of the signal which is output from the output terminal of the first buffer circuit 48. The input voltage In-48 increases from the ground level GND to the power supply level Vdd over-time. The output voltage Out-48 is obtained by inversion performed by the CMOS inverter included in the first buffer circuit 48, and thus decreases from the power supply level Vdd to the ground level GND.

The first pass transistor network 48a includes three CMOS transmission gate 41 through 43. Therefore, when the input voltage of the first buffer circuit 48 changes from the LOW level to the HIGH level, the voltage level rises from the ground level GND to the power supply level Vdd. Therefore, the gradient of the rise of the input voltage In-48 from the LOW level to the HIGH level is not slow. The input voltage In-48 is input to the input terminal of the first buffer circuit 48, and the output voltage Out-48 is output from the output terminal of the first buffer circuit 48. The output voltage Out-48 is waveform-shaped by the first buffer circuit 48 and thus exhibits a steep transit characteristic.

The output voltage Out-48 is input to the source of the CMOS transmission gate 44 of the second pass transistor network 49a. The output voltage Out-48, which periodically changes from a HIGH level to a LOW level, passes through the three CMOS transmission gates 44 through 46 connected in series and then is input to the input terminal of the second buffer circuit 49 as an input voltage In-49. When the input voltage of the second buffer circuit 49 changes from the HIGH level to the LOW level, the voltage level falls from the power supply level Vdd to the ground level GND. Therefore, the gradient of the fall of the input voltage In-49 from the HIGH level to the LOW level is not slow. As a consequence, the input voltage In-49 is input to the input terminal of the second buffer circuit 49 in the state where the waveform is not substantially made non-sharp, although being delayed by the CMOS transmission gates 44 through 46. The input voltage In-49 is amplified and waveform-shaped in the second buffer circuit 49 and output to an external circuit as an output voltage Out-49 having a steep rise characteristic.

Figure 17:
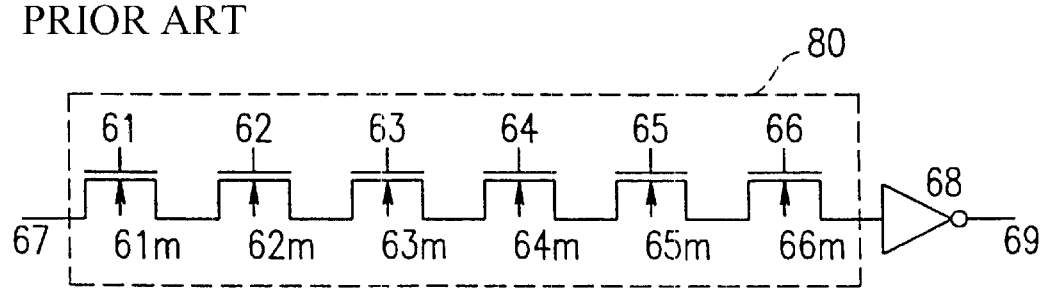
FIG. 17 shows a structure of a pass transistor network included in the conventional pass transistor logic circuit shown in FIG. 16.
Figure 18:
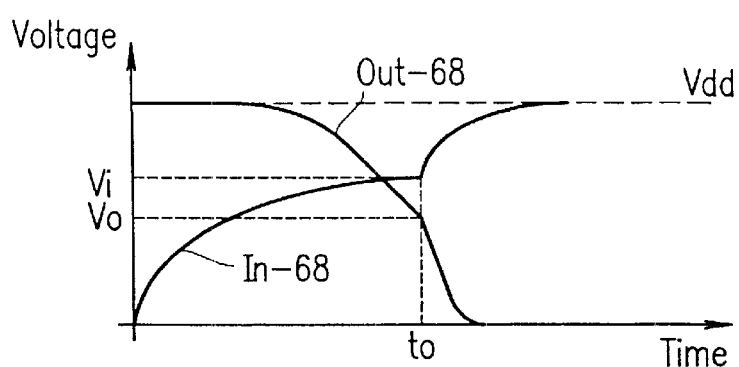
FIG. 18 is a graph illustrating a delay characteristic of input and output voltages of a buffer circuit included in the pass transistor network shown in FIG. 17.
Figure 19:
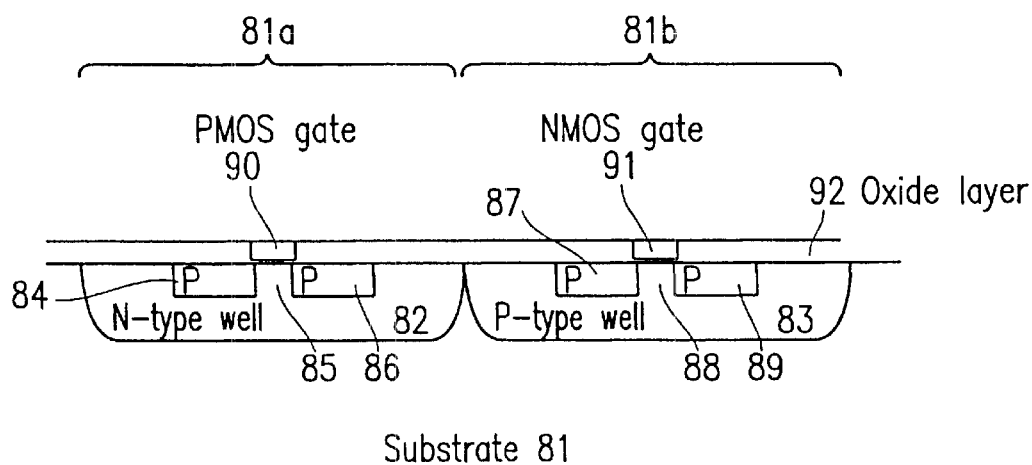
FIG. 19 is a cross-sectional view of a CMOS inverter formed using a conventional bulk process.
Figure 20A:
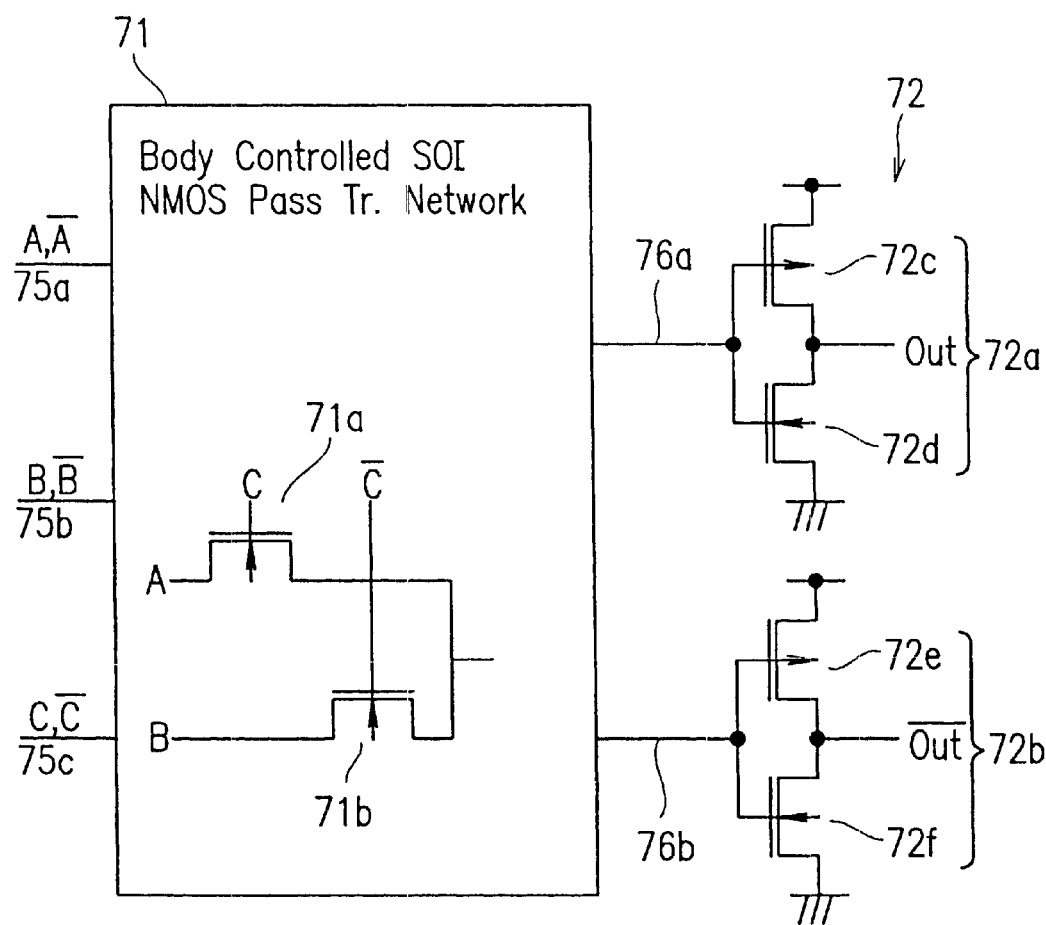
FIG. 20A shows a structure of a conventional pass transistor logic circuit formed using an SOI technique.
Figure 20B:
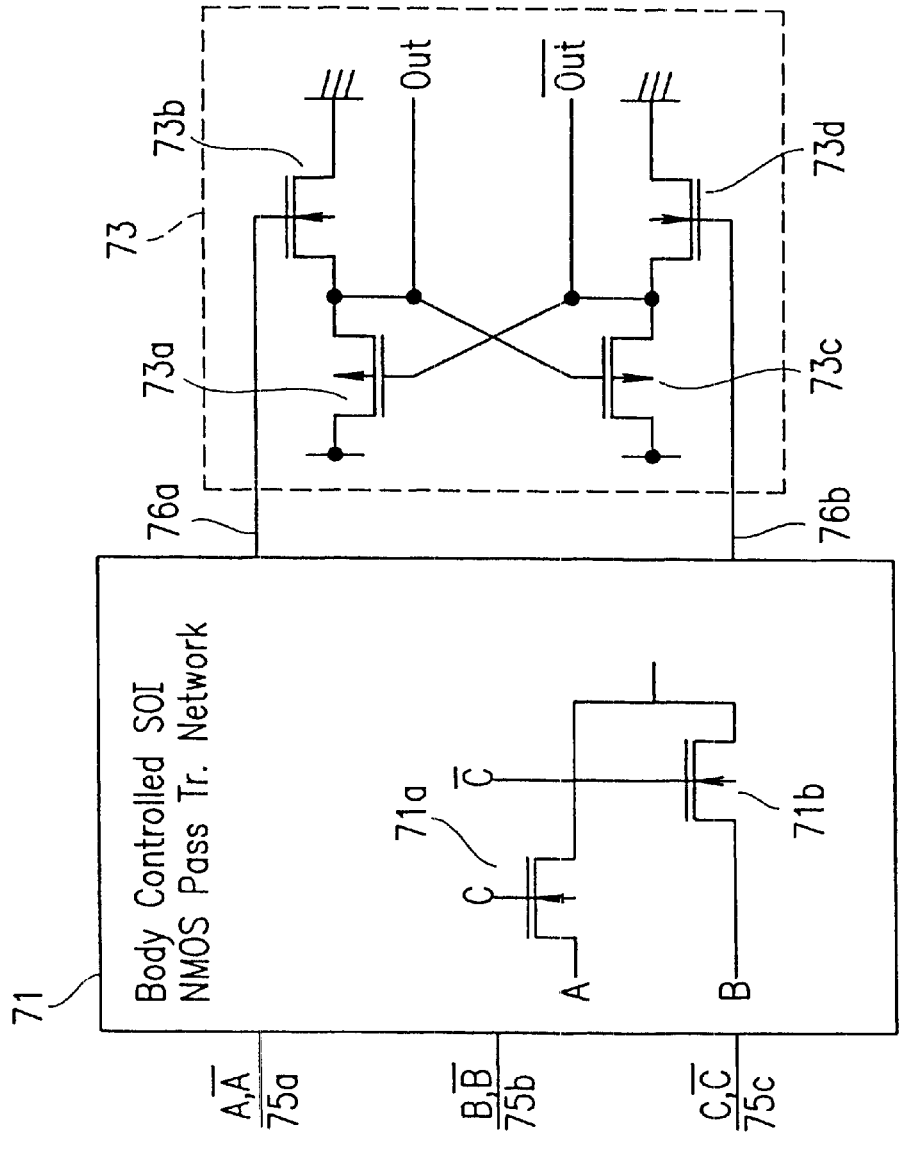
FIG. 20B shows a structure of another conventional pass transistor logic circuit formed using an SOI technique.
Figure 21:
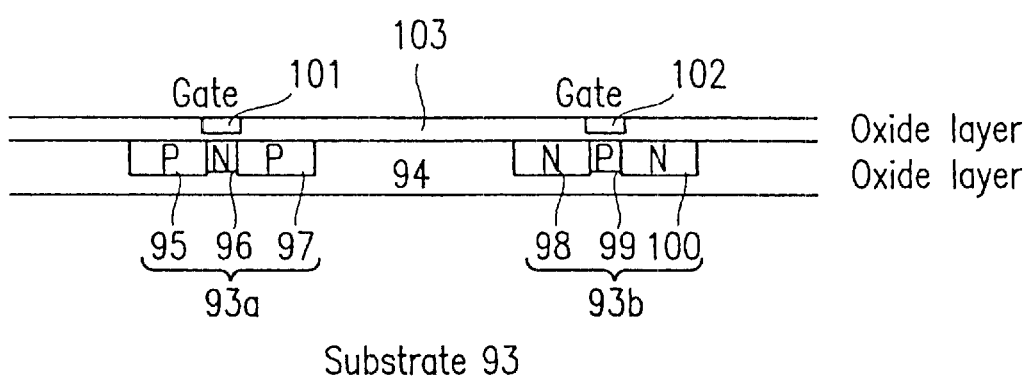
FIG. 21 is a cross-sectional view of a CMOS inverter formed using an SOI technique.

As described above, the pass transistor logic circuit 610 shown in FIG. 12 includes the CMOS transmission gates 41 through 46, in place of the N-type MOSFETs in the conventional pass transistor logic circuit including shown in FIG. 17, and includes the first buffer circuit 48 between the three CMOS transmission gates 41 through 43 and three CMOS transmission gates 44 through 46. Due to such a structure, the pass transistor logic circuit 610 causes the rise and fall of the signal voltage output from the second buffer circuit 49 to be steeper than in the conventional pass transistor logic circuit including shown in FIG. 17. Therefore, the non-sharpness of the signal waveform during the transition time is alleviated. As a result, the pass transistor logic circuit 610 shown in FIG. 12 shortens the signal delay time so as to increase the speed of signal voltage transmission and also suppresses the shoot-through current so as to reduce the current consumption.

As described above, in a pass transistor logic circuit including a pass transistor network which includes multistage CMOS transmission gates connected in series, a buffer circuit can be inserted every appropriate number of CMOS transmission gates. In this way, the non-sharpness of the signal transmission characteristic is alleviated, and the current consumption is reduced.

In the pass transistor logic circuit 110 shown in FIG. 1 and the pass transistor logic circuit 610 shown in FIG. 12, the buffer circuit inserted between the pass transistor networks is an inverter type circuit. Therefore, the pass transistor network provided before the inserted buffer circuit needs to have a structure so as to provide a negative logical output with respect to a prescribed network logic. FIG. 14 shows an example of a non-inverter type buffer circuit 140.

In FIG. 14, the non-inverter type buffer circuit 140 includes an inverter type buffer circuit Buf-1 (corresponding to the buffer circuits shown in FIGS. 2, 4, 6, 8 and 10) and another inverter type buffer circuit Buf-2. As the buffer circuit Buf-2, the buffer circuit shown in FIG. 6 or 10 is usable. Such a non-inverter type buffer circuit can be inserted between appropriate devices without changing the structure of the devices.

FIG. 15 shows results of measuring the delay time and the current consumption of various combinations of a pass transistor network including six N-type MOSFETs or CMOS transmission gates connected in series, with an inserted intermediate buffer circuit. The current consumption obtained when a pass transistor network including N-type MOSFETs with no intermediate buffer circuit is used is set as 100%.

In a pass transistor network including N-type MOSFETs, insertion of an intermediate buffer circuit alleviates the influence of the voltage level of the input signal to the intermediate buffer circuit being lower than the power supply voltage level Vdd by a threshold voltage of the N-type MOSFETs. As a result, the delay time is shortened so as to increase the operation speed, and the current consumption is also reduced.

In a pass transistor network including CMOS transmission gates, the signal voltage is not reduced, the delay time is shortened as to increase the operation speed, and the current consumption is also reduced, even without an intermediate buffer circuit. Insertion of an intermediate buffer circuit further shortens the delay time and further reduces the current consumption.

As described above, in a pass transistor logic circuit including a pass transistor network which includes multi-stage devices, such as N-type MOSFETs or CMOS transmission gates, connected in series, a buffer circuit can be inserted every appropriate number of devices in consideration of the characteristics of the devices. In this way, the signal transmission characteristic is improved, and the current consumption is reduced.

The devices such as, for example, P-type MOSFETs, N-type MOSFETs and CMOS transmission gates which can be included in a pass transistor logic circuit according to the present invention have a structure designed using an SOI technique. Therefore, the junction capacitance of the source region and the drain region, which acts as a load capacitance of a buffer circuit including a CMOS inverter is significantly small. The rise and fall of the output voltage of such devices are steep during the transition time, which increases the speed of signal transmission and reduces the current consumption. In addition, such devices do not need a P-type layer or an N-type layer, unlike the case of using a bulk process. Thus, even when a pass transistor network includes CMOS transmission gates or even when a buffer circuit is added to the conventional structure, an increase in the area of the CMOS transmission gates or the additional buffer circuit on the substrate is restricted to be minimal. A buffer circuit according to the present invention is usable when the pass transistor network includes multi-stage P-type MOSFETs or N-type MOSFETs.

A semiconductor integrated circuit according to the present invention includes a plurality of logical devices such as, for example, N-type MOSFETs 1m through 6m, which include an SOI substrate including a semiconductor substrate and an insulating layer provided on the semiconductor substrate. An intermediate buffer circuit 10 such as, for example, a CMOS inverter is inserted between appropriate logical devices among the plurality of logical devices. Due to such a structure, the non-sharpness of the signal waveform during the transition time is alleviated. As a result, the signal delay time is shortened so as to increase the speed of signal voltage transmission, and also the shoot-through current is suppressed so as to reduce the current consumption.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit, comprising:
   a plurality of logical elements connected in series, the plurality of logical elements including a semiconductor substrate and an insulating layer provided on the semiconductor substrate; and
   a buffer circuit connected directly between a first logical element group including at least three of the plurality of logical elements and a second logical element group including at least two of the plurality of logical elements,
   wherein an input terminal is connected to said first logical element group and an output voltage of said first logical element group is wave-form shaped by the buffer circuit so that the buffer circuit provides an output voltage having a steep transit characteristic to the second logical element group.

2. The semiconductor integrated circuit according to claim 1, wherein the logical elements are N-type MOSFETs.

3. The semiconductor integrated circuit according to claim 1, wherein the logical elements are P-type MOSFETs.

4. The semiconductor integrated circuit according to claim 1, wherein the buffer circuit is a CMOS inverter including a P-type MOSFET and an N-type MOSFET.

5. The semiconductor integrated circuit according to claim 1, wherein the buffer circuit includes a first P-type MOSFET and a CMOS inverter including a second P-type MOSFET and an N-type MOSFET, a source of the first P-type MOSFET is connected to a power supply line, and a drain and a gate of the first P-type MOSFET are respectively connected to an input terminal and an output terminal of the CMOS inverter.

6. The semiconductor integrated circuit according to claim 1, wherein the buffer circuit includes a first N-type MOSFET and a CMOS inverter including a P-type MOSFET and a second N-type MOSFET, a source of the first N-type MOSFET is connected to a ground line, and a drain and a gate of the first N-type MOSFET are respectively connected to an input terminal and an output terminal of the CMOS inverter.

7. The semiconductor integrated circuit according to claim 4, wherein a threshold voltage of the P-type MOSFET is set to be a high level.

8. The semiconductor integrated circuit according to claim 5, wherein a threshold voltage of the second P-type MOSFET is set to be a high level.

9. The semiconductor integrated circuit according to claim 4, wherein a threshold voltage of the N-type MOSFET is set to be a high level.

10. The semiconductor integrated circuit according to claim 6, wherein a threshold voltage of the second N-type MOSFET is set to be a high level.

11. The semiconductor integrated circuit according to claim 1, wherein the buffer circuit is a non-inverter type buffer circuit including two inverter circuits connected in series.

12. The semiconductor integrated circuit according to claim 11, wherein one of the inverter circuits of the non-inverter type buffer circuit is a buffer circuit including a CMOS inverter including a P-type MOSFET and an N-type MOSFET.

13. The semiconductor integrated circuit according to claim 11, wherein one of the inverter circuits of the non-inverter type buffer circuit is a buffer circuit including a first P-type MOSFET and a CMOS inverter including a second P-type MOSFET and an N-type MOSFET, a source of the first P-type MOSFET is connected to a power supply line, and a drain and a gate of the first P-type MOSFET are respectively connected to an input terminal and an output terminal of the CMOS inverter.

14. The semiconductor integrated circuit according to claim 11, wherein one of the inverter circuits of the non-inverter type buffer circuit is a buffer circuit including a first N-type MOSFET and a CMOS inverter including a P-type MOSFET and a second N-type MOSFET, a source of the first N-type MOSFET is connected to a ground line, and a drain and a gate of the first N-type MOSFET are respectively connected to an input terminal and an output terminal of the CMOS inverter.

15. A semiconductor integrated circuit, comprising:
a plurality of logical elements connected in parallel, the plurality of logical elements including a semiconductor substrate and an insulating layer provided on the semiconductor substrate;
a buffer circuit connected directly between a first logical element group and a second logical element group, the first logical element group including at least two logical elements connected in parallel in series with another two logical elements connected in parallel in series with yet another two logical elements connected in parallel, the second logical element group including at least two logical elements connected in parallel in series with another two logical elements connected in parallel, wherein
an input terminal is connected to said first logical element group and an output voltage of said first logical element group is wave-form shaped by the buffer circuit so that the buffer circuit provides an output voltage having a steep transit characteristic to the second logical element group.

16. The semiconductor integrated circuit according to claim 15, wherein the logical elements are CMOS transmission gates each including a P-type MOSFET and an N-type MOSFET.

17. The semiconductor integrated circuit according to claim 15, wherein the buffer circuit is a CMOS inverter including a P-type MOSFET and an N-type MOSFET.

18. The semiconductor integrated circuit according to claim 15, herein the buffer circuit includes a first P-type MOSFET and a CMOS inverter including a second P-type MOSFET and an N-type MOSFET, a source of the first P-type MOSFET is connected to a power supply line, and a drain and a gate of the first P-type MOSFET are respectively connected to an input terminal and an output terminal of the CMOS inverter.

19. The semiconductor integrated circuit according to claim 15, wherein the buffer circuit includes a first N-type MOSFET and a CMOS inverter including a P-type MOSFET and a second N-type MOSFET, a source of the first N-type MOSFET is connected to a ground line, and a drain and a gate of the first N-type MOSFET are respectively connected to an input terminal and an output terminal of the CMOS inverter.

20. The semiconductor integrated circuit according to claim 17, herein a threshold voltage of the P-type MOSFET is set to be a high level.

21. The semiconductor integrated circuit according to claim 18, wherein a threshold voltage of the second P-type MOSFET is set to be a high level.

22. The semiconductor integrated circuit according to claim 17, wherein a threshold voltage of the N-type MOSFET is set to be a high level.

23. The semiconductor integrated circuit according to claim 19, wherein a threshold voltage of the second N-type MOSFET is set to be a high level.

24. The semiconductor integrated circuit according to claim 15, wherein the buffer circuit is a non-inverter type buffer circuit including two inverter circuits connected in series.

25. The semiconductor integrated circuit according to claim 24, wherein one of the inverter circuits of the non-inverter type buffer circuit is a buffer circuit including a CMOS inverter including a P-type MOSFET and an N-type MOSFET.

26. The semiconductor integrated circuit according to claim 24, wherein one of the inverter circuits of the non-inverter type buffer circuit is a buffer circuit including a first P-type MOSFET and a CMOS inverter including a second P-type MOSFET and an N-type MOSFET, a source of the first P-type MOSFET is connected to a power supply line, and a drain and a gate of the first P-type MOSFET are respectfully connected to an input terminal and an output terminal of the CMOS inverter.

27. The semiconductor integrated circuit according to claim 24, herein one of the inverter circuits of the non-inverter type buffer circuit is a buffer circuit including a first N-type MOSFET and a CMOS inverter including a P-type MOSFET and a second N-type MOSFET, a source of the first N-type MOSFET is connected to a ground line, and a drain and a gate of the first N-type MOSFET are respectfully connected to an input terminal and an output terminal of the CMOS inverter.

28. A semiconductor integrated circuit, comprising:
a plurality of logical elements connected in a series, the plurality of logical elements including a semiconductor substrate and an insulating layer provided on the semiconductor substrate; and
a buffer circuit connected directly between a first logical element group including at least three of the plurality of logical elements and a second logical element group including at least two of the plurality of logical elements, wherein
an input terminal is connected to said first logical element group and an output voltage of said first logical element group is wave-form shaped by the buffer circuit so that the buffer circuit provides an output voltage having a steep transit characteristic to the second logical element group;
and wherein the semiconductor integrated circuit is formed on an SOI substrate.

29. A semiconductor integrated circuit, comprising:
a plurality of logical elements connected in parallel, the plurality of logical elements including a semiconductor substrate and an insulating layer provided on the semiconductor substrate; and
a buffer circuit connected directly between a first logical element group and a second logical element group, the first logical element group including at least two logical elements connected in parallel in series with another two logical elements connected in parallel in series with yet another two logical elements connected in parallel, the second logical element group including at least two logical elements connected in parallel in series with another two logical elements connected in parallel, wherein
an input terminal is connected to said first logical element group and an output voltage of said first logical element group is wave-form shaped by the buffer circuit so that the buffer circuit provides an output voltage having a steep transit characteristic to the second logical element group; and
wherein the semiconductor integrated circuit is formed on an SOI substrate.

* * * * *